(12) United States Patent
Inoue

(10) Patent No.: US 9,531,331 B2
(45) Date of Patent: Dec. 27, 2016

(54) AMPLIFIER COMPENSATING DRIFT AFTER SUDDEN DECREASE OF DRAIN CURRENT

(71) Applicant: Sumitomo Electric Device Innovations, Inc., Yokohama-shi (JP)

(72) Inventor: Shingo Inoue, Yokohama (JP)

(73) Assignee: Sumitomo Electric Device Innovations, Inc., Yokohama-shi (JP)

( * ) Notice: Subject to any disclaimer, the term of this patent is extended or adjusted under 35 U.S.C. 154(b) by 0 days.

(21) Appl. No.: 14/626,726

(22) Filed: Feb. 19, 2015

(65) Prior Publication Data

US 2016/0248385 A1   Aug. 25, 2016

(51) Int. Cl.
*H03F 1/14*   (2006.01)
*H03F 1/30*   (2006.01)
*H03F 1/34*   (2006.01)
*H03F 3/193*   (2006.01)

(52) U.S. Cl.
CPC .............. *H03F 1/301* (2013.01); *H03F 1/342* (2013.01); *H03F 3/193* (2013.01); *H03F 2200/18* (2013.01); *H03F 2200/375* (2013.01); *H03F 2200/451* (2013.01); *H03F 2200/462* (2013.01)

(58) Field of Classification Search
CPC .................................... H03F 1/14; H03F 3/16
USPC .................................................. 330/290, 282
See application file for complete search history.

(56) References Cited

U.S. PATENT DOCUMENTS

| | | | | |
|---|---|---|---|---|
| 5,371,477 A | * | 12/1994 | Ikeda | H03G 3/3047 330/282 |
| 5,670,911 A | * | 9/1997 | Hori | H03F 3/1935 330/277 |
| 6,917,187 B2 | * | 7/2005 | Okubo | G05F 1/569 323/275 |
| 7,057,467 B2 | * | 6/2006 | Miyake | G01J 1/46 257/E31.054 |
| 8,890,620 B2 | * | 11/2014 | Tamanoi | H03F 1/56 330/124 R |
| 9,141,120 B2 | * | 9/2015 | Usuda | G05F 1/575 |
| 2013/0135053 A1 | * | 5/2013 | Tamanoi | H03F 1/56 330/296 |
| 2014/0117957 A1 | * | 5/2014 | Usuda | G05F 1/575 323/280 |

FOREIGN PATENT DOCUMENTS

JP   2013-009200 A   1/2013

* cited by examiner

*Primary Examiner* — Henry Choe
(74) *Attorney, Agent, or Firm* — Venable LLP; Michael A. Sartori; Laura G. Remus

(57) ABSTRACT

An RF amplifier that compensates the drift appearing after a sudden decrease of the drain current is disclosed. The RF amplifier detects the drain current by the bias control unit that feeds the change of the drain current back to the gate bias of the FET. The bias control unit responds to the sudden increase of the drain current by a relatively longer time constant; while, to the sudden decrease thereof by the second time constant enough shorter than the first time constant to compensate the drift appearing after the sudden decrease of the drain current.

11 Claims, 9 Drawing Sheets

AMPLIFIER COMPENSATING DRIFT AFTER SUDDEN DECREASE OF DRAIN CURRENT

TECHNICAL FIELD

The present application relates to an amplifier, in particular, the application relates to an amplifier that compensates, what is called, the drift of the drain idle current.

BACKGROUND

Recent mobile communication system requires an amplifier to have enhanced power efficiency. One solution to improve the power efficiency of the amplifier is that an amplifier implementing a transistor made of gallium nitride (GaN) based material instead for silicon (Si) and/or gallium arsenide (GaAs) based materials. Such an amplifier using GaN based transistor may operate at higher power supply and in larger current density because of wider energy gap of GaN material. Also, the GaN based material enables to use a substrate with superior thermal conductivity.

However, the GaN based transistor inherently shows large instability appearing in the drain current thereof after a large radio frequency (RE) signal is output. Such instability is often called as the drift of the drain current, or the current collapsing. Specifically, when the input RE signal enters in burst mode in the transistor operating in the AB-class, the drain current after sudden cut-offs of the input RE signal is over decreased and gradually recovers the original magnitude. The drift of the drain current causes degradation in the gain and/or the distortion appearing in the output signal of the transistor. Some prior arts have reported that the drift of the drain current may overcome by a complex mechanism to switch the gate bias.

SUMMARY

An aspect of the present application relates to an amplifier that receives an RF signal whose amplitude varies in burst mode. The amplifier includes an FET, a current detector, and a bias control unit. The FET inherently shows a drift of the drain current after a sudden decrease of the drain current. The current detector detects the drain current and generates a status signal corresponding to the drain current. The bias control unit, by receiving the status signal, generates a gate bias for the FET responding to a sudden increase of the drain current, which is equivalent to a decrease of the status signal, by a first time constant; and responding to a sudden decrease of the drain current, which corresponds to the increase of the status signal, by a second time constant enough shorter than the first time constant. Thus, the bias control unit may adjust the gate bias for the FET substantially only for the sudden decrease of the drain current and compensate the drift appearing in the drain current alter the sudden decrease.

BRIEF DESCRIPTION OF THE DRAWINGS

The present invention will now be described by way of example only and not in any limitative sense with reference to the accompanying drawings in which.

DETAILED DESCRIPTION

Next, some embodiments according to the present invention will be described as referring to drawings. In the description of the drawings, numerals or symbols same with or similar to each other will refer to elements same with or similar to each other without duplicating explanations.

First Embodiment

Figure 1:
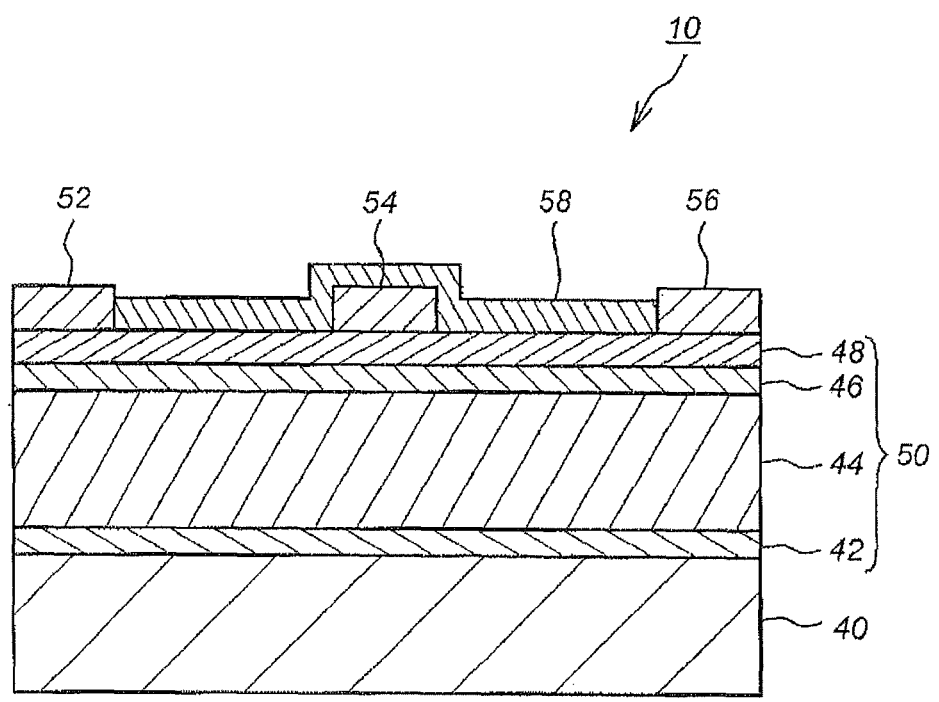
FIG. 1 shows a cross section of an FET implemented within the RF amplifier of embodiment of the present invention.

FIG. 1 shows a cross section of a field effect transistor (FET) applicable to the first embodiment of the present invention. The FET 10 includes on a substrate 40, a buffer layer 42, an electron transporting layer 44, an electron supplying layer 46, and a cap layer 40, as shown in FIG. 1. The layers, 42 to 48, grown on the substrate 10 forms a nitride semiconductor device 50. The substrate 10 may be made of silicon carbide (SiC), sapphire ($Al_2O_3$), and/or silicon (Si). The buffer layer 42 may be made of aluminum nitride (AlN) with a thickness of 300 nm. The electron transporting layer 44 may be made of gallium nitride (GaN) with a thickness of 1000 nm. The electron supplying layer 46 may be made of n-type aluminum-gallium-nitride (AlGaN) with a thickness of 20 nm. The cap layer 48 may be made of n-type GaN with a thickness of 5 nm. The nitride semiconductor device 50 further provides, on the cap layer 48, a gate 54, a source 52, and a drain 56, where the source 52 and the drain 56 put the gate 54 therebetween. The source 52 and the drain 56 include a stacked metal made of tantalum (Ta) and aluminum (Al) from the side of the cap layer 48; while, the gate 54 includes another metal stack of nickel (Ni) and gold (Au) also from the side of the cap layer 48. An insulating film 58, typically made of silicon nitride (SiN) covers the gate 54 and the top surface of the cap layer 48 exposed between the gate 54 and the source 52, and between the gate 54 and the drain 56. The nitride semiconductor device 50 is not restricted to those materials described above. Other nitride materials, such as InGaN, AlInGaN, InAlN, and so on, may be used in the nitride semiconductor device 50.

The nitride semiconductor device 50 has a hetero-junction between the substrate 40 and the nitride device 50, which inevitably induces in the hetero-interface or in the buffer layer 42 close to the hetero-interface, deep electron traps that capture or release electrons to cause, what is called, the drain current drift. Vacancies or impurities originating in the hetero junction seem to induce the deep electron traps. Thus, the drain current drift is a phenomenon specific to the nitride semiconductor device. However, embodiments described below are not restricted to circuits for nitride semiconductor devices, but applicable to devices showing time degradation accompanied with a comparably long time constant.

Figure 2:
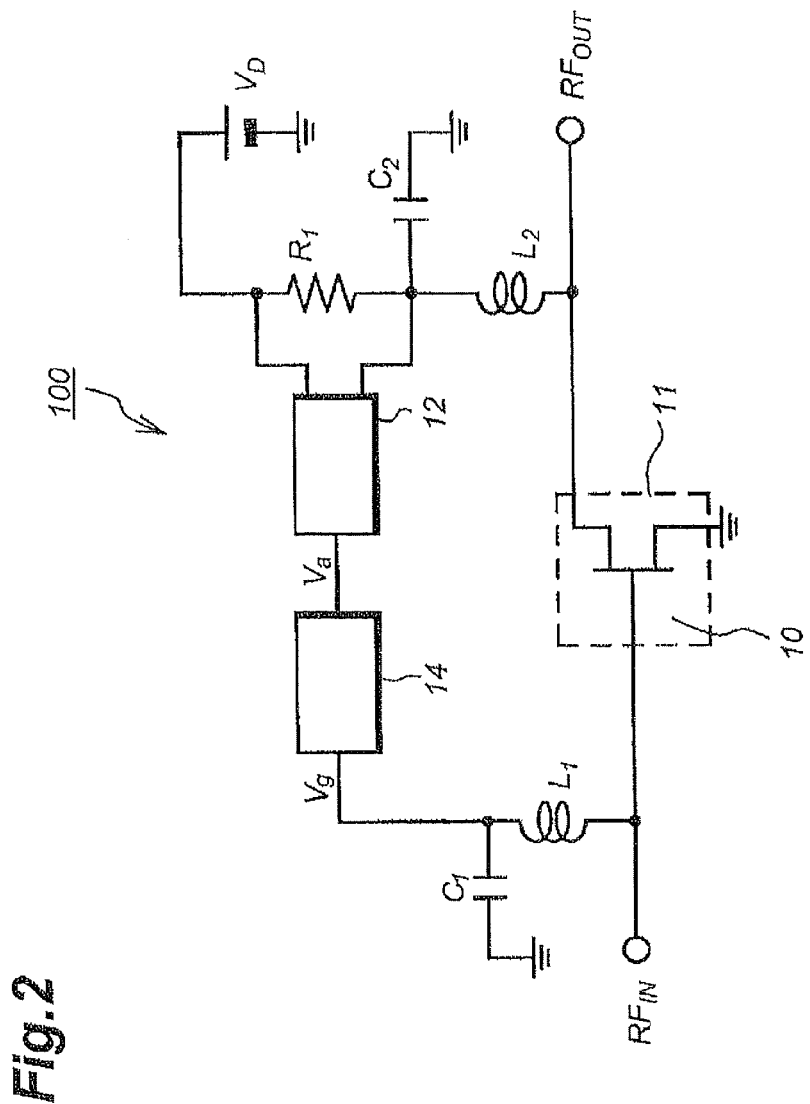
FIG. 2 shows a functional block diagram of the RF amplifier according to the first embodiment of the invention.

FIG. 2 is a functional block diagram of an RF amplifier 100 according to the first embodiment of the present application. The amplifier 100 includes an amplifying section 11, a current detector 12, and a bias control unit 14. The amplifying section 11 includes an FET 10 made of nitride semiconductors with the grounded source, the gate receiving an input RF signal $RF_{IN}$ from the input terminal, and the drain biased by the power supply $V_D$ through a series circuit of a sensing resistor $R_1$ and an inductor $L_2$. The gate is biased by the bias control unit 14 through another inductor $L_1$. Two capacitors, $C_1$ and $C_2$, each constitute respective bypass capacitors. In the embodiment shown in FIG. 2, the FET 10 is assumed to operate in the AB-class, in which the gate bias is ideally kept constant so as to flow relatively small current in the drain when no input RF signal $RG_{IN}$ is provided but an extremely large current exceeding several amperes flows in the drain for the substantial input RF signal $RF_{IN}$.

The current detector 12 may detect a voltage drop caused in the resistor $R_1$ by the current flowing into the drain of the FET 10. That is, the current detector 12 may detect the drain current $I_D$ of the FET 10 and outputs a status signal $V_a$ corresponding to the magnitude of the current $I_D$ as reversing the polarity thereof. The bias control unit 14 adjusts the gate bias $V_g$ of the FET 10. The bias control unit 14, receiving the status signal $V_a$, generates a gate bias Vg responding to the falling edge of the status signal $V_a$ by the first time constant and to the rising edge of the status signal $V_a$ by the second time constant enough shorter than the first time constant.

Figure 3:
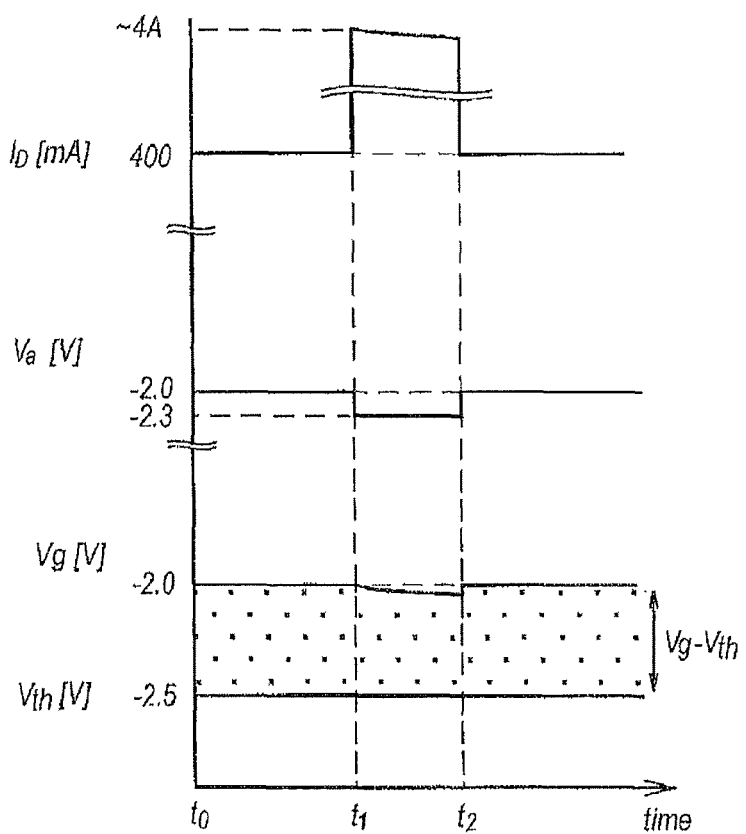
FIG. 3 schematically illustrates time behaviors of parameters attributed to the RF amplifier, where FIG. 3 assumes that the FET shows no drift in the drain current.

FIG. 3 shows time behaviors of various parameters attributed to the amplifier 100, where FIG. 3 assumes that the FET 10 shows no drift in the drain current thereof. The parameter $V_{th}$ is the threshold voltage of the FET 10. FIG. 3 further assumes the initial conditions at $t_0$ of the drain current $I_D$, the threshold voltage $V_{th}$, the status signal $V_a$, and the gate bias Vg to be 400 mA, −2.5 V, −2 V, and −2 V, respectively.

The input RF signal $RF_{11}$ becomes large during a period from $t_1$ to $t_2$, which causes the drastic increase of the drain current $I_D$ to around four (4) amperes and the decrease of the status signal $V_a$ to −2.3 V, where the current detector 12 is assumed to reverse the polarity of the input signal, namely, the drain current $I_D$. Because of no drain current drift, the threshold $V_{th}$ is maintained to be −2.5 V independent of the increase and the rapid decrease of the drain current $I_D$. The bias control unit 14 generates the gate bias Vg such that, responding to the falling edge of the status signal $V_a$ by the first time constant, the gate bias Vg gradually decreases and rapidly increases responding to the rising edge of the status signal $V_a$ by the second time constant enough shorter than the first time constant. Because the first time constant is enough longer than the period from $t_1$ to $t_2$, the gate bias Vg shows substantially no decrease from the initial value of −2 V. After the drain current decreases at $t_2$, which recovers the status signal $V_a$ the initial value of −2.0 V, the gate bias Vg promptly follows the rapid increase of the status signal $V_a$ from −2.3 V to −2.0 V by the second time constant.

Because the bias control unit 14 has relatively longer time constant for the falling edge of the status signal $V_a$, the gate bias Vg output from the bias control unit 14 is substantially kept constant to be −2.0 V even when the drain current $I_D$ rapidly increases at $t_1$, which rapidly decreases the status signal $V_n$. When the gate bias Vg responds to the decrease of the status signal $V_a$, which means that, when the drain current $I_D$ becomes large, the gate bias Vg decreases so as to reduce the drain current $I_D$, which is equivalent for the FET 10 to decrease the gain and increase the distortion in the output thereof. The RF amplifier 100, because the bias control unit 14 has the relatively longer first time constant for the falling edge of the status signal $V_a$, the gate bias Vg is substantially kept constant in the period from $t_1$ to $t_2$.

Figure 4:
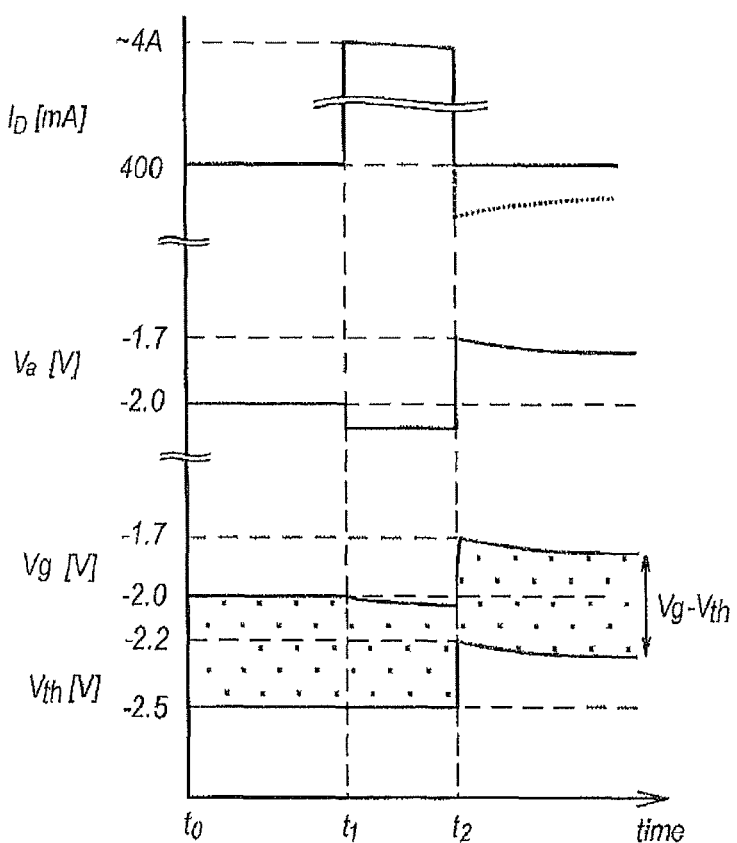
FIG. 4 schematically illustrates time behaviors of the parameters same with those appeasing in FIG. 3, where FIG. 4 assumes that the FET inherently shows the drift in the drain current.

FIG. 4 shows time behaviors of various parameters of the RF amplifier 100 of the embodiment, where the FET 10 explicitly shows the drill in the drain current. Assuming the RF amplifier 100 has no bias control unit 14, the drain current $I_D$ showing the drift behaves as that illustrated by a dotted line in FIG. 4; that is, the drain current $I_D$ shows a large undershoot at the sudden decrease thereof and gradually increases to recover the original value of 400 mA. Because of the undershoot of the drain current $I_D$, the threshold voltage $V_{th}$ is regarded to be increased to, for instance, −2.2 V, which means the gate-source bias $V_{gs}$ with respect to the threshold voltage $V_{th}$, namely $V_{gs}-V_{th}$, is decreased responding to the drift of the drain current when the gate bias Vg is kept constant to be −2.0 V.

On the other hand, the bias control unit 14 of the embodiment may compensate this reduction of the drain current. That is, responding to the undershoot of the drain current $I_D$, the status signal $V_a$ shows an overshoot to a maximum of −1.7 V. The bias control unit 14 promptly responds this overshoot of the status signal $V_a$ and generates the gate bias Vg based on the status signal $V_a$. The gate bias Vg rapidly increases to, for instance, −1.7 V from −2.0 V. Thus, because the threshold voltage $V_{th}$ and the gate bias Vg both shows the overshoot, which means that the gate-source bias Vgs with respect to the threshold voltage $V_{th}$, namely $V_{gs}-V_{th}$, is kept substantially in constant, the drain current drift resultantly disappears as illustrated in the solid line in the top behavior of FIG. 4. The threshold voltage $V_{th}$, the status signal $V_a$, and the gate bias Vg gradually recover respective original values as compensating the drain current drift.

The first embodiment of the present application provides the bias control unit 14 that responds the falling edge of the status signal $V_a$, which corresponds to the increase of the drain current $I_D$, by the first time constant; while, the rising edge of the status signal $V_a$ corresponding to the decrease of the drain current $I_D$ by the second time constant enough shorter than the first time constant. That is, the bias control unit 14 may generate the gate bias that promptly follows only the undershoot of the drain current due to the drift. Thus, the drift in the drain current inherently appearing in an FET, in particular, an FET made of nitride semiconductor materials, may be adequately compensated.

The first time constant for the rising/increase of the drain current $I_D$ is preferably longer than a period where the input RF signal $RF_{IN}$ becomes large, namely, from t1 to t2; that is, the first time constant is preferably around 100 ms to prevent the gate bias from varying for the period from $t_1$ to $t_2$. The second time constant for the falling/decrease of the drain current $I_D$ is preferably enough faster than a time constant for the drain current drift, namely, the second time constant is preferably shorter than 1 μs.

Second Embodiment

Figure 5:
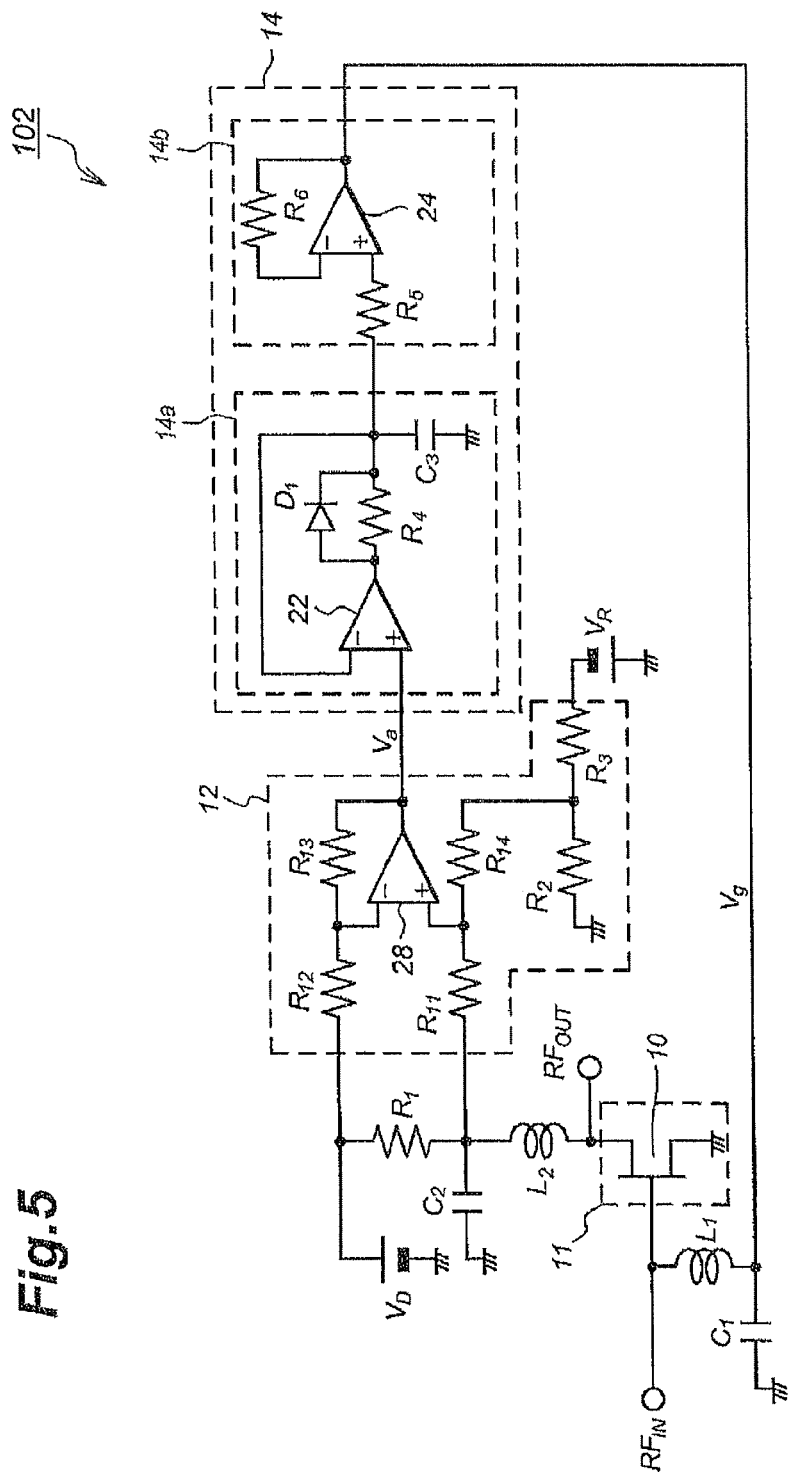
FIG. 5 shows a circuit diagram of the amplifier according to an embodiment of the present invention.

FIG. 5 is a circuit diagram of an RF amplifier according to the second embodiment of the present invention. The current detector 12 shown in FIG. 5 includes a differential amplifier 28 and resistors, $R_{11}$ to $R_{14}$. As described in FIG. 2, the FET 10 is biased in the drain thereof by the power supply $V_D$ through the series circuit of the sensing resistor $R_1$ and the inductor $L_2$. The sensing resistor $R_1$ causes a voltage drop by the drain current $I_D$ of the FET 10, and the differential amplifier 28 with resistors, $R_{11}$ to $R_{14}$, amplify this voltage drop by the arrangement of the inverting amplifier. That is, resistors, $R_{11}$ and $R_{14}$, are connected in series between the sensing resistor $R_1$ and a resistive divider formed by resistors, $R_2$ and $R_3$; while, resistors, $R_{12}$ and $R_{13}$, are connected in series between the power supply voltage $V_D$ and the output of the differential amplifier 28. The inverting input of the differential amplifier 28 couples with the intermediate node of the former two resistors, $R_{12}$ and $R_{13}$; while, the non-inverting input thereof couples with the intermediate node of the latter series circuit, $R_{11}$ and $R_{14}$. These resistors, $R_{11}$ to $R_{14}$, determine the voltage gain of the differential amplifier 28. Thus, the differential amplifier 28 amplifies the voltage drop generated in the sensing resistor $R_1$ in the arrangement of the inverting amplifier to generate a status signal $V_a$. The resistive divider constituted of two resistors, $R_2$ and $R_3$, and the reference $V_R$ adjusts the offset appearing in the status signal $V_a$ of the differential amplifier 28.

The bias control unit 14 includes two stages, 14a and 14b, the former includes a differential amplifier 22, a diode $D_1$, a resistor $R_4$, and a capacitor $C_3$, while, the latter includes another differential amplifier 24. The latter stage 14b operates as a voltage buffer for the former stage 14a. The differential amplifier 22 in the former stage 14a receives the status signal $V_a$ of the current detector 12 in the non-inverting input thereof. The diode $D_1$ connected in parallel with the resistor $R_4$ is put between the output of the differential amplifier 22 and the output of the former stage 14a. The capacitor $C_3$ is connected between the output of the former stage 14a and the ground. The output of the former stage 14a is fully fed back to the inverting input of the differential amplifier 22. The former stage 14a thus configured operates as a peak detector; and has feature that the capacitor $C_3$ is charged and discharged by the parallel circuit of the diode $D_1$ and the resistor $R_4$. That is, the charging of the capacitor $C_3$ is performed primarily by the forwardly biased diode $D_1$ when the status signal $V_a$ is greater than the output of the former stage 14a. On the other hand, the discharging is primarily performed by the resistor $R_4$ when the status signal $V_a$ is less than the output of the former stage 14a.

Because an equivalent resistance of a forwardly biased diode is several ohms to several scores ohms and that of a reversely biased diode becomes several mega-ohms; the equivalent resistance of the parallel circuit of the diode $D_1$ and the resistor $R_4$ may be determined substantially only by the resistance of the diode $D_1$ when the diode $D_1$ is forwardly biased and by the resistance of the resistor $R_4$ when the diode $D_1$ is reversely biased. Accordingly, setting the resistance of the resistor $R_4$ is far greater than the resistance of the forwardly biased diode $D_1$ and far less than the resistance of the reversely biased diode $D_1$; the discharging time constant of the capacitor $C_3$, namely, the first time constant, is determined by the resistor $R_4$, while, the charging time constant of the capacitor $C_3$, namely, the second time constant or the rising time constant, may be determined by the forwardly biased diode $D_1$.

The second stage 14b includes a differential amplifier 24 and two resistors, $R_5$ and $R_6$. The second stage 14b operates as a voltage follower, that is, the resistor $R_5$ is put between the output of the first stage 14a and the non-inverting input of the differential amplifier 24. The other resistor $R_6$ is put between the output and the inverting input of the differential amplifier 24. The second stage 14b thus operated as the voltage follower enhances the input impedance and reduces the output impedance thereof. Two resistors, $R_5$ and $R_6$, cause no function to set the gain of the differential amplifier 24, but only compensate the input offset currents. The enhanced input impedance prevents the capacitor $C_3$ from being discharged by the input current of the differential amplifier 24.

Figure 6A:
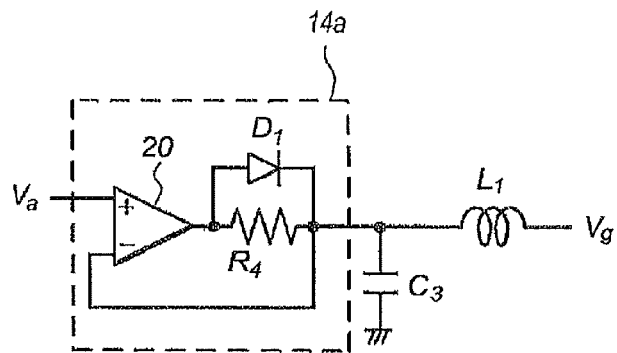
FIG. 6A to 6C shows examples of the control unit including in the bias control unit of the RF amplifier.
Figure 6B:
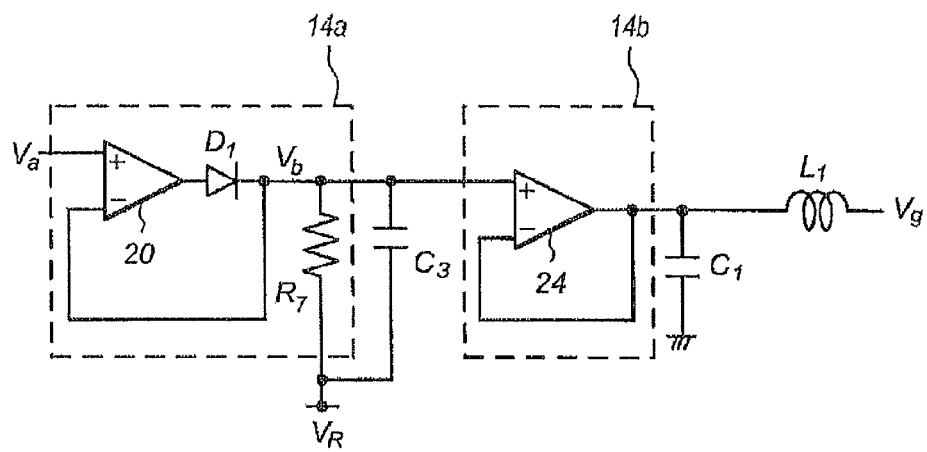
Figure 6C:
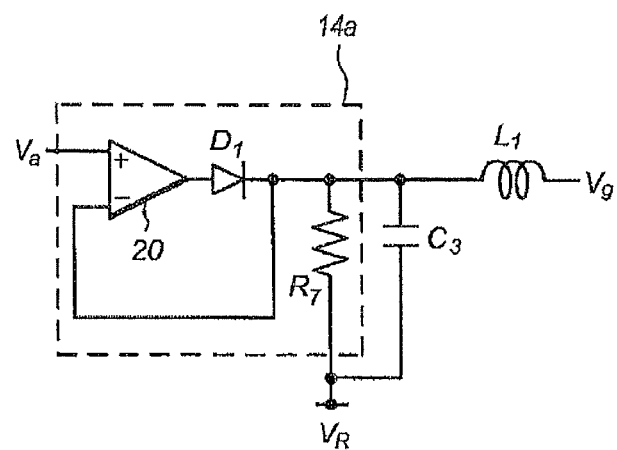

FIGS. 6A to 6C are circuit diagrams of the bias control unit 14 modified from that shown in FIG. 5. The bias control unit 14 shown in FIG. 9A removes the second stage 14b, that is, the capacitors, $C_1$ and $C_3$, where the former is provided to determine the first and second time constants while the latter is provided to bypass the high-frequency components, are replaced into one capacitor $C_3$.

The modified bias control unit 14 shown in FIG. 6B removes the resistor $R_4$ provided to determine the first time constant but provides a resistor $R_7$, instead of the resistor $R_4$, connected in parallel to the diode $D_1$. The charging of the capacitor $C_3$ is done by the same manner with that of the aforementioned embodiment, namely, through the diode $D_1$; however, the discharging of the capacitor $C_3$ is carried out through the resistor $R_7$ to a power supply $V_R$. Setting the resistance of the resistor $R_7$ to be far greater than the resistance of the forwardly biased diode $D_1$ and far less than the resistance of the reversely biased diode $D_1$, the first time constant, namely the falling time constant, of the gate bias Vg may be enough longer than the second time constant. Although the circuit of FIG. 6B removes two resistors, $R_5$ and $R_6$, in second stage 14b, these two resistors, $R_5$ and $R_6$, are preferably provided in the circuit. Moreover, the second stage 14b in FIG. 6B may be removed as shown in FIG. 6C.

Figure 7A:
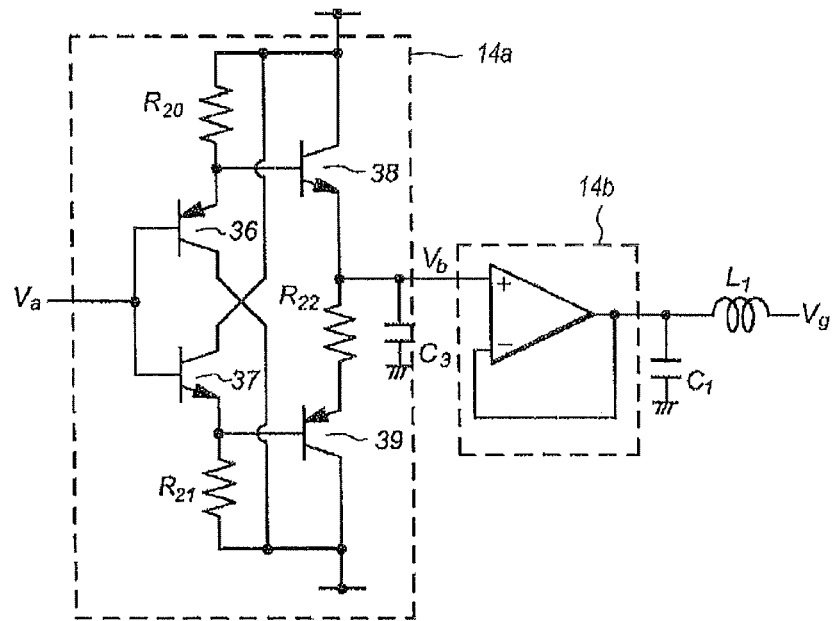
FIGS. 7A and 7B shows other examples of the control unit.
Figure 7B:
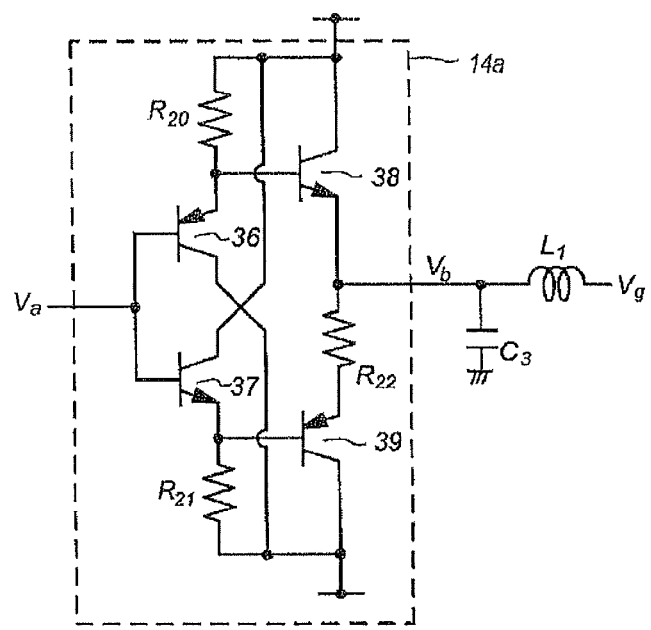

FIGS. 7A and 7B illustrate other examples of the bias control 14. The bias control unit 14 shown in FIGS. 7A and 7B provides two pnp-transistors, 36 and 39, two npn-transistors; 37 and 38, and three resistors, $R_{20}$ to $R_{22}$. Referring to FIG. 7A, transistors, 36 and 38, constitute a voltage follower for the status signal $V_a$ greater than the gate bias Vg; while, the other transistors, 37 and 39, constitute another voltage follower for the status signal $V_a$ less than the gate bias Vg. The charging of the capacitor $C_3$ when the status signal $V_a$ becomes greater than the gate bias Vg is performed directly by two transistors, 36 and 38. On the other hand, the discharging of the capacitor $C_3$ is carried by the other two transistors, 37 and 39, but indirectly through the resistor $R_{22}$ put between the capacitor $C_3$ and the transistor 39. Accordingly, the first time constant, the falling time constant, becomes greater than the second time constant, namely, the rising time constant. The circuit shown in FIG. 7B removes the second stage 14b; namely, the voltage follower, as those shown in FIGS. 6A and 6C.

Figure 8A:
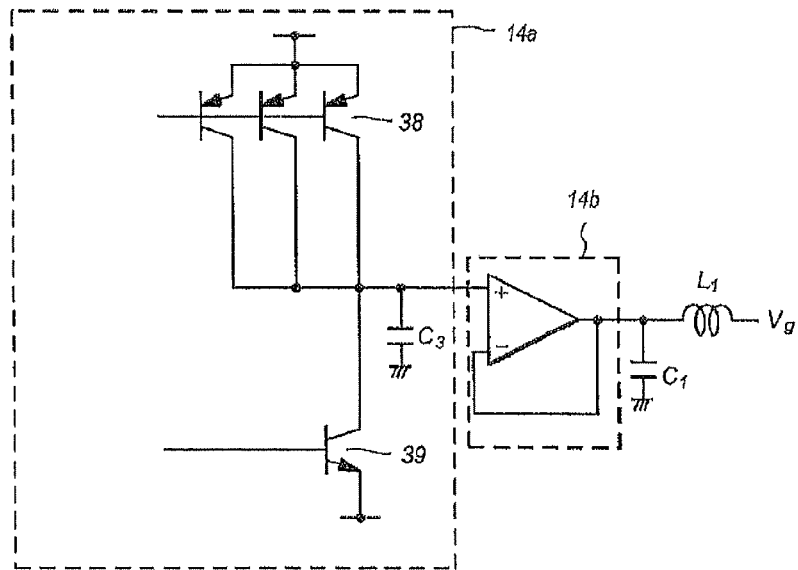
FIGS. 8A and 8B shows still other examples of the control unit.
Figure 8B:
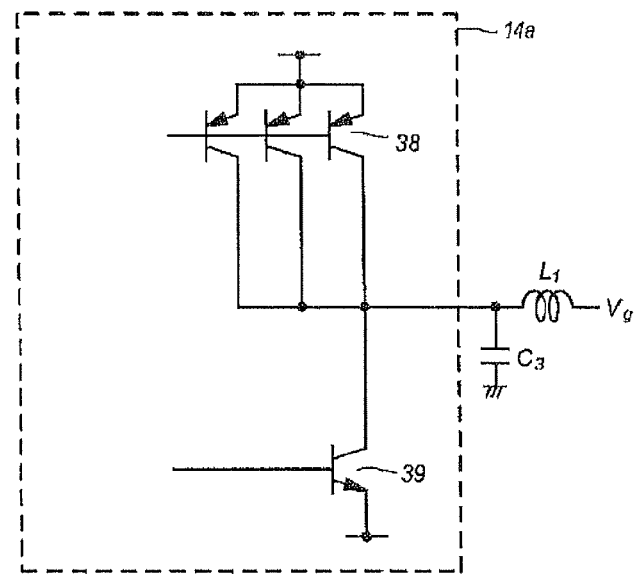

FIGS. 8A and 8B show still another example of the bias control unit 14 which are modified from that shown in FIG. 7A and show output stages of general purpose operational amplifiers having the function of the rail-to-rail capability. In the control unit shown in FIG. 8A removes the resistor $R_{22}$ put between the capacitor $C_3$ and the transistor 39, but increases the size of the pnp transistor 38 to charge the capacitor $C_3$, where FIG. 8A illustrates three transistors are connected in parallel to each other, which means the size of the transistor 38 shown in FIG. 7A is enlarged by three times. However, the number of the pnp transistors is not restricted to be three. Four or more pnp transistors, or, another pap-transistor having a greater size may be applicable to the bias control unit 14 of FIG. 8A. On the other hand, the npn transistor 39 in the lower side, which discharges the capacitor $C_3$, in the size thereof is left unchanged, namely, same with that shown in FIG. 7A. The bias control unit 14 having such an arrangement of the output transistors charges the capacitor $C_3$ faster than the time to discharge the capacitor $C_3$. FIG. 8B further removes the second stage 14b as those of FIGS. 6A, 6C, and 7B.

Third Embodiment

Figure 9A:
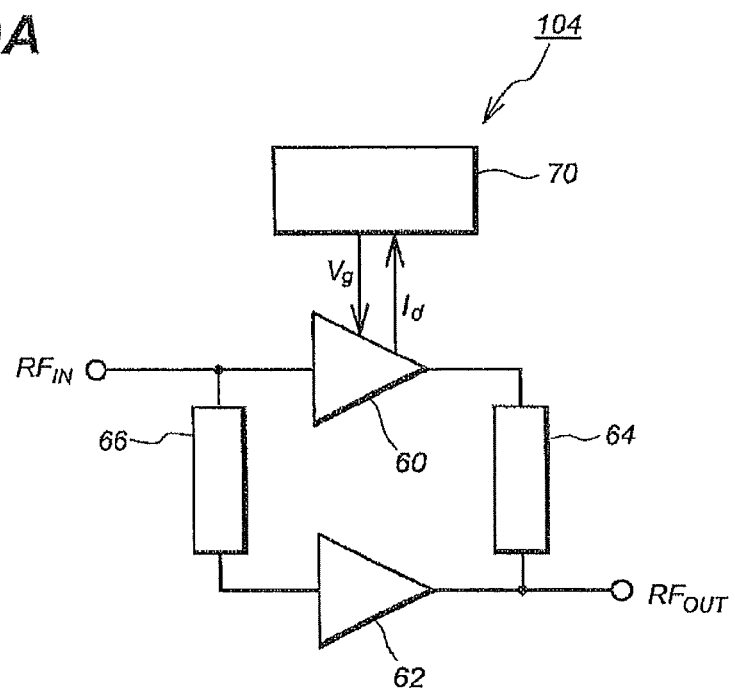
FIG. 9A shows a functional block diagram of another type of an RF amplifier having the configuration of the Doherty amplifier.

The third embodiment of the present invention applies the RP amplifier of the first and second embodiments to a Doherty amplifier. FIG. 9A is a functional diagram of a Doherty amplifier of the third embodiment. The RF amplifier 104 includes a primary amplifier 60, a subsidiary amplifier 62, two transmission lines, 64 and 66, with a quarter wavelength, and a bias generator 70. Two amplifiers, 60 and 62, are connected in parallel accompanied with the quarter wavelength transmission lines, 64 and 66, between the input $RF_{IN}$ and the output $RF_{OUT}$. That is, the primary amplifier 60 directly couples with the input $RF_{IN}$ but indirectly couples with the output $RF_{OUT}$ through the quarter wavelength transmission line 64. While, the subsidiary amplifier 62 indirectly couples with the input $RF_{IN}$ through the other quarter wavelength transmission line 66 and directly couples with the output $RF_{OUT}$. The primary amplifier 60 operates in the AB-class, while, the subsidiary amplifier 62 operates in the B-class or the C-class, that is, the subsidiary amplifier 62 becomes active only when the input RF signal exceeds a preset power. The primary amplifier 60 always operates with relatively lower distortion in the output thereof. On the other hand, the secondary amplifier 62 may generate an extremely high output $RF_{OUT}$ with relatively larger distortion. In the Doherty amplifier shown in FIG. 9A, the bias generator 70 of the present invention becomes useful especially for the primary amplifier 60 because the amplifier 11 driven by the bias control unit 14 may compensate the drift appearing in the drain current after the sudden decrease thereof and the amplifier 11 may effectively suppress the distortion in the output thereof.

Fourth Embodiment

Figure 9B:
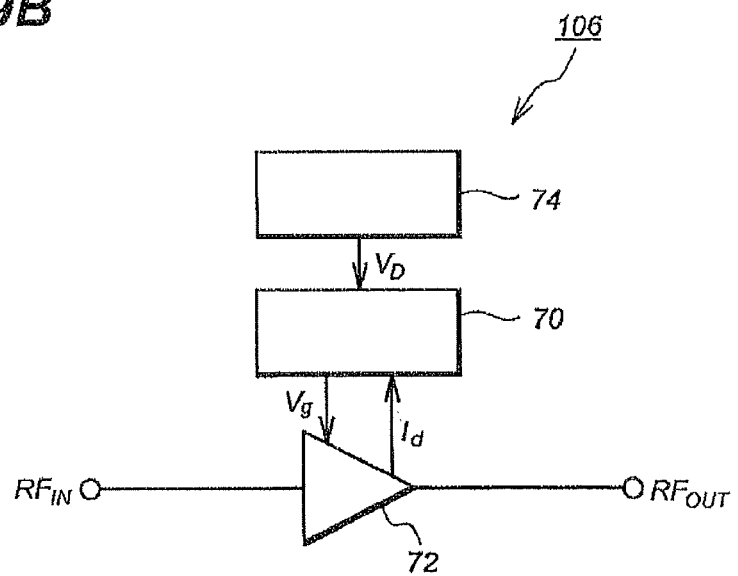
FIG. 9B shows a functional block diagram of still another type of an RF amplifier having the configuration of the envelope tracking of the input RF signal.

The forth embodiment of the present invention applies the RF amplifier to an amplifier of the type of the envelope tracking amplifier. FIG. 9B shows a functional block diagram of an RF amplifier 106 of the envelope tracking type. The RF amplifier 106 includes, in addition to the bias generator 70, an envelope tracker 74 to adjust the drain bias of the amplifier 72, namely, an FET. That is, the envelop tracker 74 promptly varies the drain bias of the FET 72 following with the amplitude of the input RF signal. When the drain bias of the FET promptly varies from, for instance, 50 V to 10 V, the FET 72 causes the drift of the drain current, which shills the operating point of the FET in relatively lower drain bias. The bias generator 70 may compensate the drift of the drain current at a lower drain bias to set the operating point in constant. Because the sensing resistor in the bias generator 70 only detects the voltage drop caused therein, the variation of the drain bias $V_D$ causes no influence of the detection of the drain current $I_d$.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. An amplifier to amplify a radio-frequency (RF) signal varying amplitude thereof, comprising:
    a field effect transistor (FET) showing a drift of a drain current after a decrease of the drain current;
    a current detector to detect the drain current and generate a status signal corresponding to the drain current; and
    a bias control unit to generate a gate bias for the FET by responding to an increase of the drain current by a first time constant and to the decrease of the drain current by a second time constant shorter than the first time constant,
    wherein the bias control unit includes a load capacitor,
    wherein the load capacitor is charged by the second time constant and discharged by the first time constant.

2. The amplifier of claim 1,
    wherein the RF signal received by the amplifier has a period when the amplitude thereof becomes greater compared with periods except for the period, and
    wherein the first time constant of the gate bias is longer than the period.

3. The amplifier of claim 2,
    wherein the drift of the drain current has a time constant, and
    wherein the second time constant is shorter than the time constant of the drift.

4. The amplifier of claim 1,
    wherein the bias control unit further includes an amplifier and a parallel circuit of a diode and a resistor, the parallel circuit being connected between an output of the amplifier and the load capacitor,
    wherein the load capacitor is charged by the amplifier through the diode by the second time constant and discharged by the amplifier through the resistor by the first time constant.

5. The amplifier of claim 4,
    wherein the diode is forwardly biased when the load capacitor is charged, and reversely biased when the load capacitor is discharged.

6. The amplifier of claim 5,
    wherein the amplifier and the parallel circuit constitute a peak detector.

7. The amplifier of claim 1,
    wherein the bias control unit further includes an amplifier, a diode, and a parallel circuit of a resistor and the load capacitor, the diode being connected between an output of the amplifier and the parallel circuit, and
    wherein the load capacitor is charged by the amplifier through the diode by the second time constant, and discharged through the resistor by the first time constant.

8. The amplifier of claim 7,
    wherein the diode in the cathode thereof is connected to the parallel circuit to constitute a peak detector.

9. The amplifier of claim 1,
    wherein the bias control unit further includes a first stage and a second stage, the first and second stages receiving the status signal from the current detector, the first stage being directly connected to the load capacitor to charge the load capacitor by the second time constant, the second stage being connected to the load capacitor through a resistor to discharge the load capacitor by the first time constant.

10. The amplifier of claim 1,
    wherein the bias control unit further includes a first stage and a second stage, the first and second stages receiving the status signal from the current detector and being directly connected to the load capacitor,
wherein the first stage includes a transistor having a size greater than a size of transistor included in the second stage to charge the load capacitor by the second time constant, the second stage discharging the load capacitor by the first time constant.

11. The amplifier of claim 1,
wherein the FET is made of nitride semiconductor materials.

* * * * *